(12) United States Patent
Winston et al.

(10) Patent No.: US 10,534,027 B2
(45) Date of Patent: Jan. 14, 2020

(54) PHASE COHERENT MAIN AND REMOTE UNITS OF A NETWORK ANALYZER

(71) Applicant: Fluke Corporation, Everett, WA (US)

(72) Inventors: William F. Winston, Lake Stevens, WA (US); Jeffrey S. Bottman, Seattle, WA (US); Theodore J. Brillhart, Seattle, WA (US)

(73) Assignee: Fluke Corporation, Everett, WA (US)

( * ) Notice: Subject to any disclaimer, the term of this patent is extended or adjusted under 35 U.S.C. 154(b) by 115 days.

(21) Appl. No.: 15/872,544

(22) Filed: Jan. 16, 2018

(65) Prior Publication Data

US 2018/0203050 A1  Jul. 19, 2018

Related U.S. Application Data

(60) Provisional application No. 62/447,302, filed on Jan. 17, 2017.

(51) Int. Cl.

| G01R 35/00 | (2006.01) |
| G01R 27/28 | (2006.01) |
| G01R 27/02 | (2006.01) |
| G01R 27/26 | (2006.01) |
| G01R 27/32 | (2006.01) |
| G01R 31/319 | (2006.01) |

(52) U.S. Cl.
CPC ............ G01R 27/28 (2013.01); G01R 27/02 (2013.01); G01R 27/2605 (2013.01); G01R 27/32 (2013.01); G01R 35/00 (2013.01); G01R 35/005 (2013.01); *G01R 31/3191* (2013.01)

(58) Field of Classification Search
CPC ...... G01R 35/005; G01R 35/00; G01R 27/28; G01R 27/02; G01R 27/2605; G01R 31/3191; G01R 27/32
USPC .... 324/74, 76.11–76.83, 202, 459, 600, 601, 324/619
See application file for complete search history.

(56) References Cited

U.S. PATENT DOCUMENTS

| 2012/0059605 A1* | 3/2012 | Chimanbhai | H04B 3/46 702/57 |
| 2014/0009170 A1* | 1/2014 | Troxler | G01N 22/00 324/637 |
| 2015/0028890 A1* | 1/2015 | Troxler | G01N 22/00 324/642 |

* cited by examiner

*Primary Examiner* — Raul J Rios Russo
(74) *Attorney, Agent, or Firm* — Seed Intellectual Property Law Group LLP

(57) ABSTRACT

A network analyzer includes a main unit and a physically separate remote unit. In at least one configuration, the main unit generates and transmits test signals through a device under test to the remote unit. Reference circuitry in the main unit uses signals from a local oscillator and an analog-to-digital ADC sample clock to produce reference signal data representative of the test signals as transmitted to the device under test. Receive circuitry in the remote unit produces received signal data representative of the test signals as received from the device under test, using the same signals from the local oscillator and ADC sample clock as used by the reference circuitry to produce the reference signal data. Comparison of the received signal data with the reference signal data indicates parameters of the device under test, including attenuation and phase shift in the test signals as caused by the device under test.

20 Claims, 2 Drawing Sheets

PHASE COHERENT MAIN AND REMOTE UNITS OF A NETWORK ANALYZER

BACKGROUND

Technical Field

This disclosure pertains to network analyzers, and more particularly, to network analyzer systems having a main unit and remote unit that are couplable to a device under test.

Description of the Related Art

Network analyzers are designed to measure parameters of electrical networks. A network analyzer typically communicates test signals at various frequencies through a device under test to produce a report that characterizes electrical properties and parameters of the device under test.

While network analyzers are frequently used to measure s-parameters of a device under test, they may also be used to measure other network parameters such as y-parameters, z-parameters, and h-parameters. S-parameters (or scattering parameters) describe the behavior of electrical networks in response to various steady state electrical signals that are communicated through the networks. Electrical properties of components such as inductors, capacitors, and resistors may be expressed using s-parameters, including gain, return loss, voltage standing wave ratio (VSWR), reflection coefficient, and amplifier stability. Although applicable at any frequency, s-parameters are mostly used with networks operating at radio frequency (RF) and microwave frequencies. S-parameters change with the measurement frequency, so the frequency of test signals must be acknowledged for any s-parameter measurements made.

Basic network analyzers include scalar network analyzers, which measure changes in amplitude only, and vector network analyzers, which measure changes in both amplitude and phase. When using a vector network analyzer comprised of a main unit coupled to one end of a device under test and a physically separate remote unit coupled to another end of the device under test, it is possible to measure changes in amplitude of test signals traversing the device under test, but changes in phase of the test signals cannot be accurately determined because the main and remote units have separate phase detection circuitry that do not operate in a phase coherent manner. The present disclosure addresses the need for phase coherent main and remote units of a network analyzer system and other needs in the art.

DETAILED DESCRIPTION

Figure 1A:
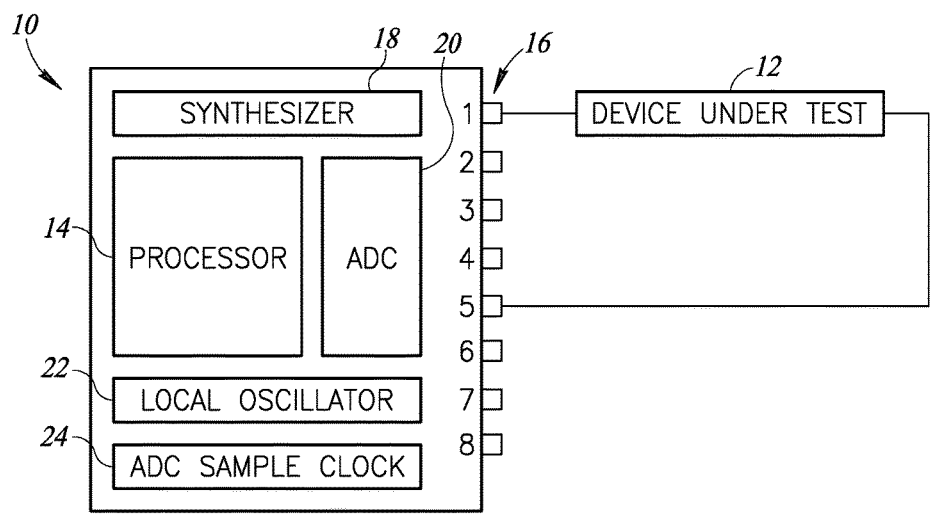
FIG. 1A is a simplified block diagram of a network analyzer coupled to connection points of a device under test.

FIG. 1A illustrates one example of a network analyzer 10, in a simplified form, coupled to a device under test 12. Under control of a processor 14, the network analyzer 10 outputs and/or receives test signals over one or more ports 16, here labeled 1 to 8. In the illustrated example, the device under test 12 is coupled to port 1 and to port 5 of the network analyzer 10. Test signals transmitted by the network analyzer via port 1 traverse the device under test 12 and are received via port 5. Depending on the characteristics of the device under test 12, a portion of the test signals transmitted via port 1 may be reflected and received back via port 1. The received test signals are then analyzed to produce measured parameters, such as s-parameters, that characterize the electrical performance of the device under test.

The network analyzer 10 includes a synthesizer 18 (also known as a signal source or signal generator) that produces test signals at a known power and at a known signal frequency or over a range of known signal frequencies. The synthesizer 18 may, for example, be a variable frequency continuous-wave signal source that uses a variable attenuator to set the power level of the signal output. The processor 14 operates to control the synthesizer 18 and circuitry in the network analyzer 10 that communicates the test signals from the synthesizer 18 to the desired port(s) for transmission to the device under test 12.

Test signals having traversed the device under test 12 and/or reflected by the device under test 12 are received by the network analyzer 10 and converted from analog to digital form for analysis by the processor 14. In this regard, analog-to-digital converter (ADC) circuitry 20 is coupled to some or all of the ports 16. Where network analyzers, such as the network analyzer 10, often transmit and receive test signals at high signal frequencies, in various embodiments it is advantageous to use a local oscillator 22 to generate a signal that, when mixed with the received test signals, downconverts the received test signals to a frequency in a range of frequencies that the ADC circuitry 20 can more readily sample. An ADC sample clock 24 provides internal timing to the processor 14 to trigger appropriate sampling of the received test signals by the ADC circuitry 20.

As test signals traverse the device under test 12, electrical components in the device under test will cause some attenuation of the test signals (observed as reduced amplitude) and introduce some delay in the test signals (observed as phase shift). Upon receipt of the test signals, the network analyzer 10 evaluates the received signals and measures the attenuation and phase shift relative to the originally-transmitted test signals. These measurements, among other measured parameters, may be stored in a memory in association with the device under test 12, and/or reported, e.g., via a display, to a user of the network analyzer 10.

Figure 1B:
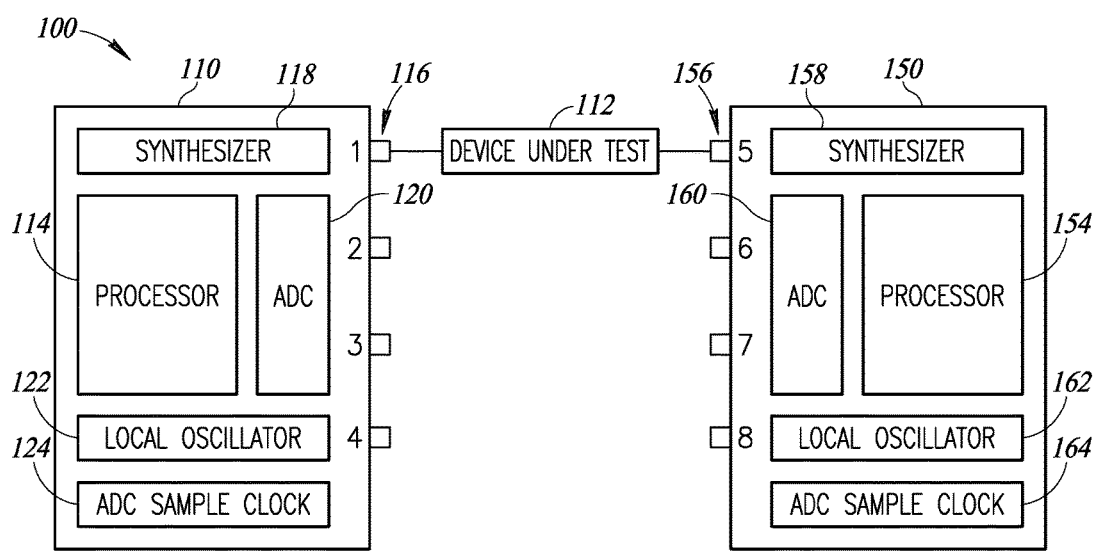
FIG. 1B is a simplified block diagram of a network analyzer comprised of a main unit and a remote unit that are respectively coupled to connection points of a device under test.

FIG. 1B illustrates another example of a network analyzer 100. In this example, the network analyzer 100 includes a main unit 110 and a remote unit 150. The main unit 110 contains components similar to the network analyzer 10 shown in FIG. 1A, including a processor 114, synthesizer 118, analog-to-digital converter (ADC) circuitry 120, local oscillator 122, and an ADC sample clock 124. The main unit 110, in this example, includes four ports 116 labeled 1 to 4.

The remote unit 150 likewise contains components similar to the network analyzer 10 shown in FIG. 1A, including a processor 154, synthesizer 158, ADC circuitry 160, local oscillator 162, and an ADC sample clock 164. The remote unit 150, in this example, includes four ports 156 labeled 5 to 8. Where the main unit 110 and the remote unit 150 each have their own test and measurement components, the main and remote units 110, 150 are each capable of transmitting and receiving test signals via their ports 116, 156. An advantage of the configuration shown in FIG. 1B is that the main unit 110 and the remote unit 150 may be positioned in separate physical locations. This is particularly useful for testing a device having points of connection at different locations that are difficult or impossible to bring together for measurement by a single device, as shown in FIG. 1A.

In the example shown in FIG. 1B, a device under test 112 is coupled to port 1 of the main unit 110 and to port 5 of the remote unit 150. If the main unit 110 is operated to transmit test signals through the device under test 112, the synthesizer 118 in the main unit 110 generates the test signals at a known power and at a known signal frequency or over a range of known signal frequencies. As with the synthesizer 18 in the network analyzer 10 in FIG. 1A, the synthesizer 118 in the main unit 110 of the network analyzer 100 may be, for example, a variable frequency continuous-wave source that uses a variable attenuator to set the power level of the signal output. The processor 114 controls circuitry in the main unit 110 to communicate the test signals from the synthesizer 118 to port 1, in this example, for transmission to the device under test 112.

In this example, test signals transmitted by the main unit 110 via port 1 traverse the device under test 112 and are received by the remote unit 150 via port 5. Depending on the characteristics of the device under test 112, a portion of the test signals transmitted via port 1 may be reflected and received back by the main unit 110 via port 1. The remaining portion of the test signals are received by the remote unit 150. The received signals are analyzed to measure parameters, such as s-parameters, that characterize the device under test 112.

The test signals received by the remote unit 150 are converted from analog to digital form for analysis by the processor 154, e.g., by ADC circuitry 160 coupled port 5 in this example. The remote unit 150 then analyzes the received signals and measures the amplitude of the received signals. This measurement, among other parameters, can be reported back to the main unit 110 (e.g., via the device under test 112 or another wired or wireless communication channel, such as a data communication cable 370), enabling the main unit 110 to determine an attenuation parameter of the device under test 112. Alternatively, the main unit 110 may communicate amplitude information of the originally-transmitted test signals to the remote unit 150 (via the device under test 112 or another wired or wireless communication channel, e.g., data communication cable 370), thereby enabling the remote unit 150 to determine an attenuation parameter of the device under test 112.

With the arrangement in FIG. 1B however, phase shift in the test signals cannot be determined by the remote unit 150 because an analysis of the phase of the received test signals relative to the originally-transmitted test signals requires sampling of the received test signals by the remote unit 150 with the same timing as used by the main unit 110 to measure phase of the originally-transmitted test signals. While the local oscillator 162 and the ADC sample clock 164 of the remote unit 150 may be selected to have characteristics that match the characteristics of the local oscillator 122 and the ADC sample clock 124 of the main unit 110, the tolerance ranges of the respective oscillators 122, 162 and clocks 124, 164 are typically broad enough that small but significant differences in the characteristics of the oscillators and clocks, as well as differences in synchronization of the oscillators and clocks, prevent high-precision phase coherency between the main and remote units that is required to accurately measure phase shift (or delay) in the test signals caused by the device under test 112.

Figure 2:
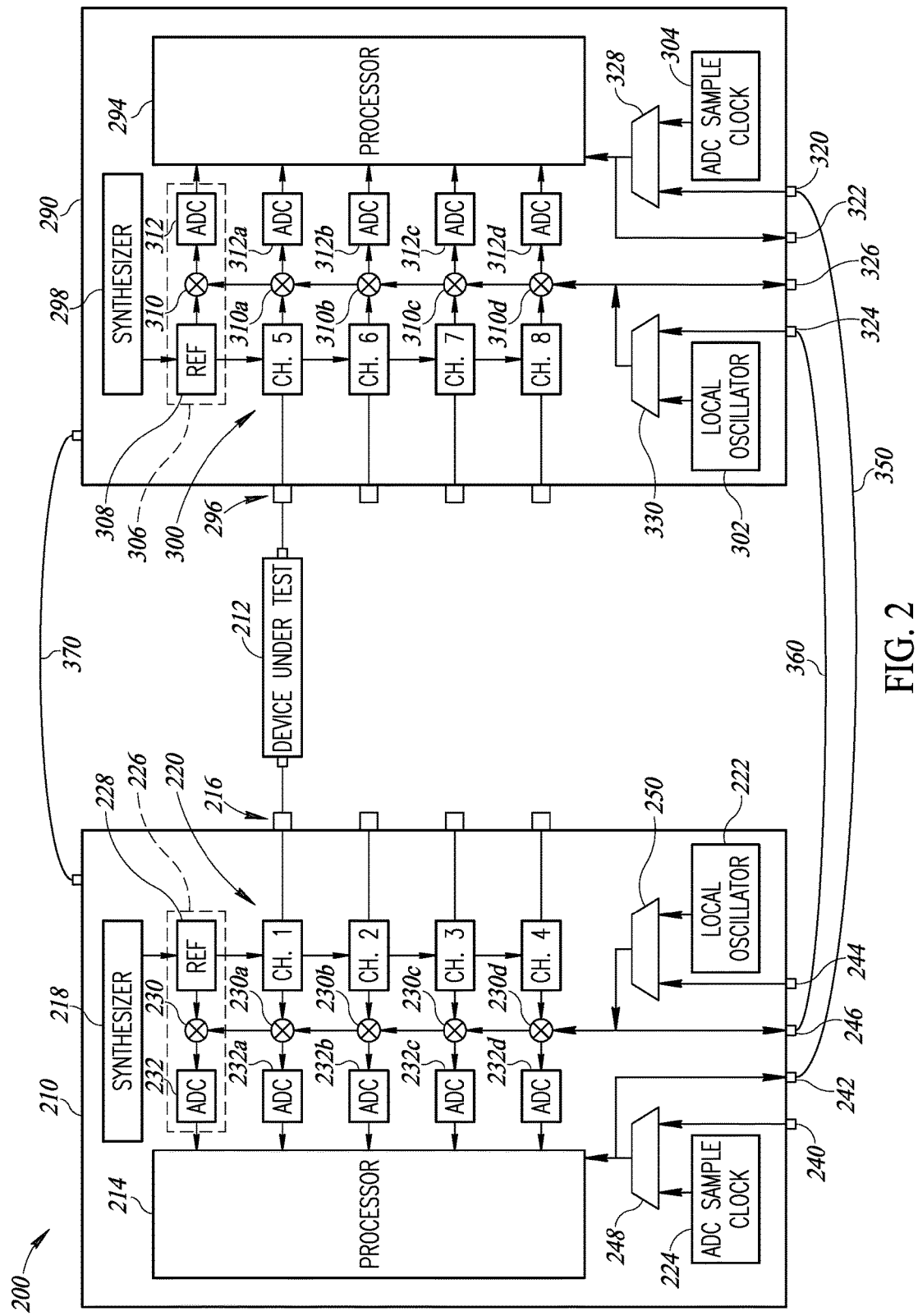
FIG. 2 is a detailed block diagram of a network analyzer comprised of a main unit and a remote unit that are respectively coupled to connection points of a device under test, with additional transfer cabling providing for phase coherent measurements of test signals traversing the device under test.

FIG. 2 illustrates, in greater detail, a network analyzer 200 comprised of a main unit 210 and a remote unit 290 in an arrangement that permits a receiving unit (be it the remote unit 290 receiving test signals that were sourced by the main unit 210, or the main unit 210 receiving test signals that were sourced by the remote unit 290) to measure both amplitude (attenuation) and phase shift (delay) in test signals that have traversed a device under test 212 relative to the originally-transmitted test signals. In FIG. 2, the main unit 210 includes four ports 216 that are each respectively coupled to channel input/output circuits 220, here labeled Ch. 1 to Ch. 4. Other embodiments of the main unit 210 may include greater or fewer ports than the four ports 216 shown. When the main unit 210 is acting to source and transmit test signals via a device under test 212, a synthesizer 218 in the main unit 210 generates the test signals at a known power and at a known signal frequency or over a range of known signal frequencies. These test signals are communicated from the synthesizer 218 to reference circuitry 226 and to one or more of the channel input/output circuits 220.

To obtain a baseline measurement of the test signals as generated by the synthesizer 218, the main unit 210 includes reference circuitry 226 that produces reference signal data representative of the generated test signals. The reference circuitry 226 in this embodiment includes a reference input circuit 228, a mixer 230, and analog-to-digital conversion (ADC) circuitry 232. The reference input circuit 228 is coupled to the synthesizer 218 to receive the test signals generated by the synthesizer. The mixer 230 receives both a signal ("LO signal") from a local oscillator 222 and the generated test signals from the reference input circuit 228, and mixes the LO signal with the generated test signals to downconvert the test signals to a frequency in a frequency range that the ADC circuitry 232 can more readily sample. The processor 214, acting on signal input from an ADC sample clock 224, triggers the ADC circuitry 232 to sample the downconverted test signals from the mixer 230. Using the sampled test signals, the processor 214 produces reference signal data that is representative of the generated test signals. As will be discussed in greater detail below, attenuation and phase shift in the test signals that traverse a device under test 212 can be determined using, in part, the reference signal data.

The remote unit 290 may similarly be configured to source and transmit test signals via a device under test 212. In that regard, a synthesizer 298 in the remote unit 290 generates test signals at a known power and at a known signal frequency or over a range of known signal frequencies. These test signals are communicated to reference circuitry 306 and to one or more channel input/output circuits 300 in the remote unit 290. In FIG. 2, the remote unit 290 includes four ports 296 that are each respectively coupled to a channel input/output circuit 300, here labeled Ch. 5 to Ch. 8. Other embodiments of the remote unit may include greater or fewer ports than the four ports 296 shown.

Similar to the main unit 210, to obtain a baseline measurement of the test signals as generated by the synthesizer 298, the remote unit 290 includes reference circuitry 306 that produces reference signal data representative of the generated test signals. The reference circuitry 306 in the remote unit 290 includes a reference input circuit 308, a mixer 310, and ADC circuitry 312 that, in this example, operate similar to the reference input circuit 228, the mixer 230, and the ADC circuitry 232 of the main unit 210. The reference input circuit 308 is coupled to the synthesizer 298 to receive the test signals generated by the synthesizer 298. The mixer 310 receives both an LO signal from a local oscillator 302 and the generated test signals from the reference input circuit 308. The mixer 310 mixes the LO signal with the generated test signals to downconvert the test signals to a frequency in a frequency range that the ADC circuitry 312 can more readily sample. The processor 294, acting on input from an ADC sample clock 304, triggers the ADC circuitry 312 to sample the downconverted test signals from the mixer 310. Using the sampled test signals, the processor 294 produces reference signal data that is representative of the test signals generated by the synthesizer 298. As with test signals generated by the main unit 210, attenuation and phase shift in the test signals generated by the remote unit 290 can later be determined, after traversing a device under test 212, based at least in part on the reference signal data produced by the remote unit 290.

The channel input/output circuits 220 in the main unit 210 each include circuitry configured and arranged to transmit test signals received from the synthesizer 218 to a respective port 216 on the main unit. Similarly, the channel input/output circuits 300 in the remote unit 290 each include circuitry configured and arranged to transmit test signals received from the synthesizer 298 to a respective port 296 on the remote unit.

Each of the input/output circuits 220, 300 in the main and remote units 210, 290 also include receive circuitry configured and arranged to receive test signals transmitted through a device under test 212 coupled to a respective port 216, 296 on the main or remote unit 210, 290. For the main unit 210, received test signals are delivered by the input/output circuits 220 to respective mixers 230a, 230b, 230c, 230d that, like the mixer 230 coupled to the reference input circuit 228, mix the received test signals with an LO signal produced by the local oscillator 222 to produce frequency-downconverted test signals. Acting on input from the ADC sample clock 224, the processor 214 in the main unit 210 triggers the ADC circuitry 232a, 232b, 232c, 232d coupled to each respective mixer 230a, 230b, 230c, 230d to sample the downconverted received test signals produced by the respective mixer. The receive circuitry of the main unit 210 thus includes at least the mixers 230a, 230b, 230c, 230d, and the respective ADC circuitry 232a, 232b, 232c, 232d. In some respects, the receive circuitry of the main unit 210 may also be considered as including aspects of the input/output circuits 220, the local oscillator 222, and the ADC sample clock 224.

Similar processing of received test signals is provided by the remote unit 290. For the remote unit 290, received test signals are delivered by the input/output circuits 300 to respective mixers 310a, 310b, 310c, 310d that, like the mixer 310 coupled to the reference input circuit 308, mix the received test signals with an LO signal produced by the local oscillator 302 to produce frequency-downconverted test signals. Acting on input from the ADC sample clock 304, the processor 294 in the remote unit 290 triggers the ADC circuitry 312a, 312b, 312c, 312d coupled to each respective mixer 310a, 310b, 310c, 310d to sample the downconverted received test signals produced by the respective mixer. The receive circuitry of the remote unit 290 thus includes at least the mixers 310a, 310b, 310c, 310d, and the respective ADC circuitry 312a, 312b, 312c, 312d. In some respects, the receive circuitry of the remote unit 290 may also be considered to include aspects of the input/output circuits 300, the local oscillator 302, and the ADC sample clock 304.

Amplitude measurements of the received test signals may be compared by either the main unit 210 or the remote unit 290 to amplitude measurements of the test signals as originally transmitted. Amplitude measurements of the originally-transmitted test signals are included in the reference signal data produced by the reference circuitry 226, 306. The difference in amplitude between the test signals as transmitted and the test signals as received indicates attenuation of the test signals by components in the device under test 212.

To obtain high-precision phase coherency between the main unit 210 and the remote unit 290 that is required to accurately measure phase delay in the received test signals, the main unit 210 and remote unit 290 further include communication ports that allow the output of the local oscillator 222, 302 and the ADC sample clock 224, 304 in one of the main or remote units 210, 290 to be communicated to other of the main or remote units 210, 290. In particular, with regard to the embodiment shown in FIG. 2, the main unit 210 includes an ADC sample clock input port 240, an ADC sample clock output port 242, a local oscillator input port 244, and a local oscillator output port 246.

A first multiplexer 248 in the main unit 210 is coupled to the processor 214 and determines whether the processor 214 receives an ADC sample clock signal from the ADC sample clock 224 or from a signal present on the ADC sample clock input port 240. The output of the first multiplexer 248 is also coupled to the main unit's ADC sample clock output port 242.

A second multiplexer 250 in the main unit 210 is coupled to the mixers 230a, 230b, 230c, 230d and determines whether the mixers 230a, 230b, 230c, 230d receive a local oscillator signal from the local oscillator 222 or from a signal present on the local oscillator input port 244. The output of the second multiplexer 250 is also coupled to the main unit's local oscillator output port 246.

The remote unit 290 similarly includes an ADC sample clock input port 320, an ADC sample clock output port 322, a local oscillator input port 324, and a local oscillator output port 326. A first multiplexer 328 in the remote unit 290 is coupled to the processor 294 and determines whether the processor 294 receives an ADC sample clock signal from the ADC sample clock 304 or from a signal present on the ADC sample clock input port 320. The output of the first multiplexer 328 is also coupled to the remote unit's ADC sample clock output port 322. A second multiplexer 330 in the remote unit 290 is coupled to the mixers 310a, 310b, 310c, 310d and determines whether the mixers 310a, 310b, 310c, 310d receive a local oscillator signal from the local oscillator 302 or from a signal present on the local oscillator input port 324. The output of the second multiplexer 330 is also coupled to the remote unit's local oscillator output port 326.

In circumstances where the main unit 210 is acting to source and transmit test signals through a device under test 212 to the remote unit 290, it is necessary for the remote unit 290 to have access to the local oscillator signal and the ADC sample clock signal produced by the local oscillator 222 and the ADC sample clock 224, respectively, in the main unit. To that end, in this example, an ADC sample clock transfer cable 350 is coupled between the ADC sample clock output port 242 of the main unit 210 and the ADC sample clock input port 320 of the remote unit 290. In this circumstance, the first multiplexer 248 in the main unit is controlled to couple the clock signal from the ADC sample clock 224 in the main unit to the processor 214 and to the ADC sample clock output port 242 of the main unit. The ADC sample clock signal that is present on the ADC sample clock output port 242 is transferred by the ADC sample clock transfer cable 350 to the ADC sample clock input port 320 of the remote unit 290. In this circumstance, the first multiplexer 328 in the remote unit is controlled to couple the ADC sample clock signal present on the ADC sample clock input port 320 to the processor 294 of the remote unit, in place of the ADC sample clock signal generated by the remote unit's ADC sample clock 304.

Furthermore, in this example, a local oscillator transfer cable 360 is coupled between the local oscillator output port 246 of the main unit 210 and the local oscillator input port 324 of the remote unit 290. In this circumstance, the second multiplexer 250 in the main unit 210 is controlled to couple the signal from the local oscillator 222 in the main unit to the mixers 230a, 230b, 230c, 230d and to the local oscillator output port 246 of the main unit. The local oscillator signal that is present on the local oscillator output port 246 is transferred by the local oscillator transfer cable 360 to the local oscillator input port 324 of the remote unit 290. The second multiplexer 330 in the remote unit 290 is controlled, in this circumstance, to couple the local oscillator signal present on the local oscillator input port 324 to the mixers 310a, 310b, 310c, 310d in the remote unit, in place of the local oscillator signal generated by the remote unit's local oscillator 302.

In this manner, the remote unit 290 has access to the ADC sample clock signal and the local oscillator signal used by the main unit 210 to generate the reference signal data representative of the test signals that were originally transmitted by the main unit 210. By using the same local oscillator signal that was used by the main unit 210, the mixers 310a, 310b, 310c, 310d of the remote unit 290 can downconvert test signals received by the remote unit 290 in a manner coherent with the downconversion of the original test signals provided by mixer 230 in the main unit's reference circuitry 226. Along the same lines, by using the same ADC sample clock signal that was used by the main unit 210, the processor 294 of the remote unit 290 can trigger the ADC circuits 312a, 312b, 312c, 312d of the remote unit to sample the received test signals in a manner coherent with the sampling of the original test signals provided by ADC circuit 232 in the main unit's reference circuitry 226. Accordingly, at each test frequency, the remote unit 290 is able to generate received signal data that is representative of the test signals as received by the remote unit 290 and communicate the received signal data back to the main unit 210 for comparison to the reference signal data originally generated by the reference circuitry 226 in the main unit. With appropriate calibration data in hand, the main unit 210 may thereafter accurately compare the phase and amplitude of the received test signals at each test frequency (in the received signal data) to the phase and amplitude of the originally-transmitted test signals at the same test frequency (in the reference signal data) to assess the characteristics of the device under test 212.

Alternatively, if the reference signal data determined by the reference circuitry 226 in the main unit 210 is communicated by the main unit to the remote unit 290, the remote unit 290 can take calibration data into account and accurately compare the amplitude and phase of the received test signals at each test frequency to the amplitude and phase of the originally-transmitted test signals at the same test frequency and thus assess the characteristics of the device under test 212.

Similar processing may be provided in circumstances where the remote unit 290 is acting to source and transmit test signals through a device under test 212 to the main unit 210. In such circumstances, it is necessary for the main unit 210 to have access to the local oscillator signal and the ADC sample clock signal produced in the remote unit 290. To that end, an ADC sample clock transfer cable similar to cable 350 would be coupled between the ADC sample clock output port 322 of the remote unit and the ADC sample clock input port 240 of the main unit 210. The first multiplexer 328 in the remote unit 290 would be controlled to couple the clock signal from the ADC sample clock 304 in the remote unit to the processor 294 and to the ADC sample clock output port 322 of the remote unit. The ADC sample clock signal that would be present on the ADC sample clock output port 322 is transferred by the ADC sample clock transfer cable to the ADC sample clock input port 240 of the main unit 210. In this circumstance, the first multiplexer 248 in the main unit is controlled so as to couple the ADC sample clock signal present on the ADC sample clock input port 240 to the processor 214 of the main unit, generally in place of the ADC sample clock signal generated by the main unit's ADC sample clock 224.

Furthermore, a local oscillator transfer cable similar to the cable 360 would be coupled between the local oscillator output port 326 of the remote unit 290 and the local oscillator input port 244 of the main unit 210. In this circumstance, the second multiplexer 330 in the remote unit 290 would be controlled to couple the signal from the local oscillator 302 in the remote unit to the mixers 310a, 310b, 310c, 310d and to the local oscillator output port 326 of the remote unit 290. The local oscillator signal that would be present on the local oscillator output port 326 is transferred by the local oscillator transfer cable 360 to the local oscillator input port 244 of the main unit. The second multiplexer 250 in the main unit 210 is controlled so as to couple the local oscillator signal present on the local oscillator input port 244 to the mixers 230a, 230b, 230c, 230d in the main unit, in place of the local oscillator signal generated by the main unit's local oscillator 222.

In this manner, the main unit 210 has access to the ADC sample clock signal and the local oscillator signal used by the remote unit 290 to generate the reference signal data representative of the test signals originally transmitted by the remote unit 290. By using the same local oscillator signal that was used by the remote unit 290, the mixers 230a, 230b, 230c, 230d of the main unit 210 can downconvert test signals received by the main unit 210 in a manner coherent with the downconversion of the original test signals provided by mixer 310 in the remote unit's reference circuitry 306. Along the same lines, by using the same ADC sample clock signal that was used by the remote unit 290, the processor 214 of the main unit 210 can trigger the ADC circuits 232a, 232b, 232c, 232d of the main unit to sample the received test signals in a manner coherent with the sampling of the original test signals provided by ADC circuit 312 in the remote unit's reference circuitry 306.

Accordingly, at each test frequency the main unit 210 is able to generate received signal data that is representative of the test signals as received by the main unit 210 and communicate the received signal data back to the remote unit 290 for comparison to the reference signal data originally generated by the reference circuitry 306 in the remote unit 290. With appropriate calibration data in hand, the remote unit 290 may thereafter accurately compare the phase and amplitude of the received test signals at each test frequency (in the received signal data) to the phase and amplitude of the originally-transmitted test signals at the same test frequency (in the reference signal data) to assess the characteristics of the device under test 212. Calibration of the network analyzer 200 is discussed in further detail below. Alternatively, if the reference signal data determined by the reference circuitry 306 in the remote unit 290 is communicated by the remote unit 290 to the main unit 210, the main unit 210 can take calibration data into account and accurately compare the amplitude and phase of the received test signals at each test frequency to the amplitude and phase of the originally-transmitted test signals at the same test frequency and thus assess the characteristics of the device under test 212.

The embodiment shown in FIG. 2 thus provides a network analyzer 200 with phase coherent main and remote units 210, 290 that allow for determination of both the attenuation and phase shift that may occur in test signals caused to traverse a device under test 212, even when the main and remote units 210, 290 are physically separate from one another.

It is, of course, recognized that the network analyzer 200 must be calibrated to take into account the effects of the connections and cabling between the main and remote units 210, 290 on the measurements made by network analyzer 200, including the ADC sample clock transfer cable 350 and the local oscillator transfer cable 360. Thus, prior to testing a device of unknown characteristics, it is appropriate to first generate calibrated corrections for the network analyzer 200 using a device having known signal transfer characteristics. The "known" device under test 212 is coupled to the main unit 210 and the remote unit 290 using connection cables that couple the known device 212 to respective ports 216, 296 of the main and remote units 210, 290.

When calibrating for use of the main unit to transmit test signals through the device under test to the remote unit, the ADC sample clock transfer cable 350 is coupled between the ADC sample clock output port 242 of the main unit and the ADC sample clock input port 320 of the remote unit, while the local oscillator transfer cable 360 is coupled between the local oscillator output port 246 of the main unit and the local oscillator input port 324 of the remote unit, as shown in FIG. 2. Alternatively, when calibrating for use of the remote unit to transmit test signals through the device under test to the main unit, the ADC sample clock transfer cable 350 is coupled between the ADC sample clock input port 240 of the main unit and the ADC sample clock output port 322 of the remote unit, while the local oscillator transfer cable 360 is coupled between the local oscillator input port 244 of the main unit and the local oscillator output port 326 of the remote unit.

Test signals are thereafter generated and transmitted through the "known" device under test 212. Received signal data representative of the test signals as received is compared to reference signal data representative of the test signals as originally transmitted to determine changes, such as in amplitude (attenuation) and phase (delay) in the test signals. Where the signal transfer characteristics of the device under test 212 are known and removed from the determined changes, the remaining changes are attributed to the circuitry of the network analyzer 200—both internal to the main and remote units 210, 290 as well as external to the main and remote units including the cables connecting the device under test 212 to the main and remote units and the ADC sample clock and local oscillator transfer cables 350, 360 coupled between the main and remote units. Calibration data based on the remaining changes are stored and later used by the network analyzer 200 when measuring a device under test 212 having unknown characteristics. By quantifying the effects of the internal and external circuitry of the network analyzer 200 on the measurement of test signals transmitted and received by the main and remote units 210, 290, respectively, the effects of the internal and external circuitry of the network analyzer 200 (i.e., calibration data) can be removed from later measurements of test signals traversing an unknown device under test 212 to obtain an accurate measurement of changes in the test signals caused by the unknown device under test 212.

Calibration data may be obtained and stored for each port 216, 296 of the main and remote units 210, 290, in both directions (where the main unit 210 is the transmitter and the remote unit 290 is the receiver, and vice versa). It is important that the same connecting and transfer cables, adapters, and fixtures that were used during calibration to generate the calibration data are later used when measuring an unknown device under test so that the proper calibration offsets can be removed from the measured data at each frequency point of the test signals. Temperature and/or other environmental conditions may also be taken into account when generating calibration data and later when measuring an unknown device under test 212 since temperature and other environmental conditions can cause different changes in the amplitude and time delay due to the internal and external circuitry of the network analyzer 200.

It will be appreciated that the various embodiments and/or aspects of the invention described above can be modified or combined to provide further embodiments of the invention.

For example, the main unit 210 and the remote unit 290 may be implemented as circuit cards having an interface that inserts into a respective slot of a circuit card cage providing common interconnections on a back plane of the card cage. One or more of the ADC sample clock transfer cable 350, the local oscillator transfer cable 360, and/or the data communication cable 370 illustrated in FIG. 2 may be provided by one or more of the common interconnections between the slots of the card cage, thus allowing signals output by one of the main or remote unit cards to be communicated to the other of the main or remote unit cards without needing to couple separate cables to input and output ports as illustrated in FIG. 2.

It is also contemplated that the main unit 210 and the remote unit 290 may include bi-directional input/output ("IO") ports and supporting circuitry for the ADC sample clocks 244, 304 and the local oscillator 222, 302. In other words, while the main unit 210 as illustrated in FIG. 2 has a separate input port 240 and output port 242 for the ADC sample clock 224, and a separate input port 244 and output port 246 for the local oscillator 222, the main unit 210 may instead have a single ADC sample clock IO port and a single local oscillator IO port. Similarly, while the remote unit 290 as illustrated in FIG. 2 has a separate input port 320 and output port 322 for the ADC sample clock 304, and a separate input port 324 and output port 326 for the local oscillator 302, the remote unit 290 may instead have a single ADC sample clock IO port and a single local oscillator IO port. Supporting circuitry for such single IO ports may include one or more buffers and/or switching circuits that control the transmission and/or reception of ADC sample clock and local oscillator signals through the IO ports. The transfer cables 350, 360 would only need to be connected to the respective single IO ports for bi-directional communication of ADC sample clock and local oscillator signals from one of the main and remote units to the other of the main and remote units.

The present disclosure further includes methods of operating a network analyzer according to various embodiments described herein. For example, at least one method of the present disclosure includes coupling a device under test between a main unit and a remote unit of the network analyzer, wherein the remote unit is physically separate from the main unit. One or more test signals is generated and transmitted from one of the main unit and remote unit through the device under test to the other of the main unit and remote unit. The method further includes producing reference signal data that is representative of the one or more test signals as transmitted to the device under test. The reference signal data is produced by reference circuitry in one of the main unit and remote unit using signals from a local oscillator and an analog-to-digital ADC sample clock. Received signal data representative of the one or more test signals as received from the device under test is produced by receive circuitry in one of the main unit and remote unit using the same signals from the local oscillator and ADC sample clock as used by the reference circuitry to produce the reference signal data. The received signal data is compared with the reference signal data to indicate parameters of the device under test, including parameters representing attenuation and phase shift in the one or more test signals caused by the device under test.

In at least one aspect, the method further comprises measuring attenuation and phase shift between the main unit and the remote unit with a known device under test and generating calibration data that is stored in a memory. The calibration data is used by the main unit or the remote unit when comparing the received signal data with the reference signal data to remove the effects of attenuation and phase shift caused by circuitry of the network analyzer.

In at least one aspect, the method further comprises coupling a local oscillator transfer cable and an ADC sample clock transfer cable between the main unit and the remote unit to enable signals from the local oscillator and ADC sample clock used by the reference circuitry to produce the reference signal data to be accessed and used by the receive circuitry that produces the received signal data. The ADC sample clock transfer cable may be coupled between a single ADC sample clock signal IO port of the main unit and a single ADC sample clock signal IO port of the remote unit, while the local oscillator transfer cable may be coupled between a single local oscillator IO port of the main unit and a single local oscillator IO port of the remote unit. Alternatively, the transfer cables may be coupled to separate input and output ports of the main unit and the remote unit.

In at least one aspect, the main unit and the remote unit may be implemented as circuit cards. In this regard, the method may comprise inserting the main unit and remote unit cards into slots of a card cage that provides common interconnections on a back plane of the card cage, and using one or more of the interconnections between the slots of the card cage to communicate the signals from the local oscillator and ADC sample clock in one of the main unit or remote unit cards to the other of the main unit or remote unit cards. This enables signals from the local oscillator and ADC sample clock used by the reference circuitry to produce the reference signal data to be accessed and used by the receive circuitry that produces the received signal data.

In at least one aspect, the network analyzer may include multiple remote units, where the method comprises coupling different devices under test between the main unit and respective remote units of the multiple remote units, wherein each remote unit is physically separate from the main unit A local oscillator transfer cable and an ADC sample clock transfer cable are coupled to the main unit to convey signals from the local oscillator and ADC sample clock of the main unit to each remote unit. This enables the receive circuitry of each remote unit to access and use the local oscillator and ADC sample clock signals of the main unit to produce the received signal data for the respective remote unit.

The multiple remote units may include at least a first remote unit and a second remote unit, and the local oscillator transfer cable and the ADC sample clock transfer cable are coupled from the main unit to the first remote unit. In this regard, the method may further comprise coupling additional transfer cables from the first remote unit to the second remote unit to convey the main unit's local oscillator signal and ADC sample clock signal from the first remote unit to the second remote unit, e.g., in a daisy chain. Alternatively, the local oscillator transfer cable and the ADC sample clock transfer cable may each be coupled from the main unit to a signal splitter to which multiple cables are connected for conveying the local oscillator and ADC sample clock signals in parallel to the multiple remote units.

Further modifications and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A network analyzer, comprising:
a main unit; and
a remote unit that is physically separate from the main unit, wherein a device under test is couplable between the main unit and the remote unit, and
wherein:
one of the main unit and remote unit is configured to generate and transmit one or more test signals through the device under test to the other of the main unit and remote unit,
reference circuitry in the one of the main unit and remote unit uses signals from a local oscillator and an analog-to-digital ADC sample clock to produce reference signal data that is representative of the one or more test signals as transmitted to the device under test,
receive circuitry in the other of the main unit and remote unit is configured to receive the one or more test signals from the device under test and produce received signal data representative of the one or more test signals as received from the device under test, using the same signals from the local oscillator and ADC sample clock as used by the reference circuitry to produce the reference signal data, and
one of the main unit and the remote unit is configured to compare the received signal data with the reference signal data to indicate parameters of the device under test, including parameters representing attenuation and phase shift in the one or more test signals as caused by the device under test.

2. The network analyzer of claim 1, further comprising a memory containing calibration data generated from measuring attenuation and phase shift in one or more test signals transmitted through a known device under test, wherein the calibration data is used by the main unit or the remote unit when comparing the received signal data with the reference signal data to remove effects of attenuation and phase shift caused by circuitry of the network analyzer outside of the device under test.

3. The network analyzer of claim 1, further comprising a local oscillator transfer cable and an ADC sample clock transfer cable that are coupled between the main unit and the remote unit to enable signals from the local oscillator and ADC sample clock used by the reference circuitry to produce the reference signal data to be accessed and used by the receive circuitry that produces the received signal data.

4. The network analyzer of claim 3, wherein the main unit and the remote unit each includes an ADC sample clock signal input port, an ADC sample clock signal output port, a local oscillator input port, and a local oscillator output port, wherein the ADC sample clock transfer cable is coupled between the ADC sample clock signal output port of one of the main unit and remote unit and the ADC sample clock signal input port of the other of the main unit and remote unit, and wherein the local oscillator transfer cable is coupled between the local oscillator output port of the one of the main unit and remote unit and the local oscillator input port of the other of the main unit and remote unit.

5. The network analyzer of claim 3, wherein the main unit and the remote unit each includes a single ADC sample clock signal IO port and a single local oscillator IO port, wherein the ADC sample clock transfer cable is coupled between the single ADC sample clock signal IO port of the main unit and the single ADC sample clock signal IO port of the remote unit, and wherein the local oscillator transfer cable is coupled between the single local oscillator IO port of the main unit and the single local oscillator IO port of the remote unit.

6. The network analyzer of claim 3, wherein the main unit and the remote unit are implemented as circuit cards that are insertable into slots of a card cage that provides common interconnections on a back plane of the card cage, and wherein one or more of the local oscillator transfer cable and the ADC sample clock transfer cable are provided by one or more of the interconnections between the slots of the card cage, thus allowing the local oscillator and ADC sample clock signals in one of the main unit or remote unit cards to be communicated to the other of the main unit or remote unit cards.

7. The network analyzer of claim 1, further comprising a first multiplexer and a second multiplexer in the one of the main unit and remote unit, wherein the first multiplexer is configured to receive input signals from the local oscillator and from a local oscillator input port that is couplable to a local oscillator output port of the other of the main unit and remote unit, and wherein the second multiplexer is configured to receive input signals from the ADC sample clock and from an ADC sample clock input port that is couplable to an ADC sample clock output port of the other of the main unit and remote unit.

8. The network analyzer of claim 1, further comprising a first multiplexer and a second multiplexer in the other of the main unit and remote unit, wherein the first multiplexer is configured to receive input signals from a local oscillator and from a local oscillator input port that is couplable to a local oscillator output port of the one of the main unit and remote unit, and wherein the second multiplexer is configured to receive input signals from an ADC sample clock and from an ADC sample clock input port that is couplable to an ADC sample clock output port of the other of the main unit and remote unit.

9. The network analyzer of claim 1, further comprising multiple remote units that are each physically separate from the main unit, wherein a different device under test is couplable between the main unit and each respective remote unit, and wherein, for each respective remote unit:
one of the main unit and remote unit is configured to generate and transmit one or more test signals through the device under test to the other of the main unit and remote unit,
reference circuitry in the one of the main unit and remote unit uses signals from a local oscillator and an analog-to-digital ADC sample clock to produce reference signal data that is representative of the one or more test signals as transmitted to the device under test,
receive circuitry in the other of the main unit and remote unit is configured to receive the one or more test signals from the device under test and produce received signal data representative of the one or more test signals as received from the device under test, using the same signals from the local oscillator and ADC sample clock as used by the reference circuitry to produce the reference signal data, and
one of the main unit and the remote unit is configured to compare the received signal data with the reference signal data to indicate parameters of the device under test, including parameters representing attenuation and phase shift in the one or more test signals as caused by the device under test.

10. The network analyzer of claim 9, further comprising a local oscillator transfer cable and an ADC sample clock transfer cable coupled to the main unit to convey signals from the local oscillator and ADC sample clock of the main unit to each remote unit, enabling the receive circuitry of each remote unit to access and use the local oscillator and ADC sample clock signals from the main unit to produce the received signal data in the respective remote unit.

11. The network analyzer of claim 10, wherein the multiple remote units include at least a first remote unit and a second remote unit, wherein the local oscillator transfer cable and the ADC sample clock transfer cable are coupled from the main unit to the first remote unit, and additional transfer cables are coupled from the first remote unit to the second remote unit to convey the main unit's local oscillator signal and ADC sample clock signal from the first remote unit to the second remote unit.

12. A method of operating a network analyzer, the method comprising:
coupling a device under test between a main unit and a remote unit of the network analyzer, wherein the remote unit is physically separate from the main unit;
generating and transmitting one or more test signals from one of the main unit and remote unit through the device under test to the other of the main unit and remote unit;
producing reference signal data that is representative of the one or more test signals as transmitted to the device under test, wherein the reference signal data is produced by reference circuitry in the one of the main unit and remote unit using signals from a local oscillator and an analog-to-digital ADC sample clock;
producing received signal data representative of the one or more test signals as received from the device under test, wherein the received signal data is produced by receive circuitry in the other of the main unit and remote unit using the same signals from the local oscillator and ADC sample clock as used by the reference circuitry to produce the reference signal data; and
comparing the received signal data with the reference signal data to indicate parameters of the device under test, including parameters representing attenuation and phase shift in the one or more test signals as caused by the device under test.

13. The method of claim 12, further comprising measuring attenuation and phase shift between the main unit and the remote unit with a known device under test and generating calibration data that is stored in a memory, wherein the calibration data is usable by the main unit or the remote unit when comparing the received signal data with the reference signal data to remove effects of attenuation and phase shift caused by circuitry of the network analyzer outside of the device under test.

14. The method of claim 12, further comprising coupling a local oscillator transfer cable and an ADC sample clock transfer cable between the main unit and the remote unit to enable signals from the local oscillator and ADC sample clock used by the reference circuitry to produce the reference signal data to be accessed and used by the receive circuitry that produces the received signal data.

15. The method of claim 14, wherein the ADC sample clock transfer cable is coupled between a single ADC sample clock signal IO port of the main unit and a single ADC sample clock signal IO port of the remote unit, and wherein the local oscillator transfer cable is coupled between a single local oscillator IO port of the main unit and a single local oscillator IO port of the remote unit.

16. The method of claim 12, wherein the main unit and the remote unit are implemented as circuit cards, the method further comprising inserting the main unit and remote unit cards into slots of a card cage that provides common interconnections on a back plane of the card cage, and using one or more of the interconnections between the slots of the card cage to communicate the signals from the local oscillator and ADC sample clock in one of the main unit or remote unit cards to the other of the main unit or remote unit cards, enabling signals from the local oscillator and ADC sample clock used by the reference circuitry to produce the reference signal data to be accessed and used by the receive circuitry that produces the received signal data.

17. The method of claim 12, further comprising:
coupling a first multiplexer in the one of the main unit and remote unit to receive input signals from the local oscillator and from a local oscillator input port that is couplable to a local oscillator output port of the other of the main unit and remote unit; and
coupling a second multiplexer in the one of the main unit and remote unit to receive input signals from the ADC sample clock and from an ADC sample clock input port that is couplable to an ADC sample clock output port of the other of the main unit and remote unit.

18. The method of claim 12, further comprising:
coupling a first multiplexer in the other of the main unit and remote unit to receive input signals from a local oscillator and from a local oscillator input port that is couplable to a local oscillator output port of the one of the main unit and remote unit; and
coupling a second multiplexer in the other of the main unit and remote unit to receive input signals from an ADC sample clock and from an ADC sample clock input port that is couplable to an ADC sample clock output port of the one of the main unit and remote unit.

19. The method of claim 12, wherein the network analyzer includes multiple remote units, the method comprising:
coupling different devices under test between the main unit and respective remote units of the multiple remote units, wherein each remote unit is physically separate from the main unit; and
coupling a local oscillator transfer cable and an ADC sample clock transfer cable to the main unit to convey signals from the local oscillator and ADC sample clock of the main unit to each remote unit, enabling the receive circuitry of each remote unit to access and use the same local oscillator and ADC sample clock signals of the main unit to produce the received signal data for the respective remote unit.

20. The method of claim 19, wherein the multiple remote units include at least a first remote unit and a second remote unit, and wherein the local oscillator transfer cable and the ADC sample clock transfer cable are coupled from the main unit to the first remote unit, the method further comprising coupling additional transfer cables from the first remote unit to the second remote unit to convey the main unit's local oscillator signal and ADC sample clock signal from the first remote unit to the second remote unit.

* * * * *